(12) United States Patent
Yu et al.

(10) Patent No.: US 10,643,736 B2
(45) Date of Patent: May 5, 2020

(54) METHOD, APPARATUS AND ELECTRONIC DEVICE FOR READ/WRITE SPEED TESTING

(71) Applicant: Zhuhai Juntian Electronic Technology Co., Ltd., Guangdong (CN)

(72) Inventors: Zhenbei Yu, Guangdong (CN); Kun Zhao, Guangdong (CN)

(73) Assignee: Zhuhai Juntian Electronic Technology Co., Ltd. (CN)

( * ) Notice: Subject to any disclaimer, the term of this patent is extended or adjusted under 35 U.S.C. 154(b) by 64 days.

(21) Appl. No.: 16/031,842

(22) Filed: Jul. 10, 2018

(65) Prior Publication Data
US 2019/0189238 A1    Jun. 20, 2019

(30) Foreign Application Priority Data

Dec. 19, 2017    (CN) .......................... 2017 1 1372642

(51) Int. Cl.
| | |
|---|---|
| *G11C 29/50* | (2006.01) |
| *G11C 29/48* | (2006.01) |
| *G11C 29/56* | (2006.01) |
| *G11C 29/26* | (2006.01) |

(52) U.S. Cl.
CPC ........ *G11C 29/50012* (2013.01); *G11C 29/48* (2013.01); *G11C 29/56* (2013.01); *G11C 29/56012* (2013.01); *G11C 2029/2602* (2013.01)

(58) Field of Classification Search
CPC .................................................... G11C 29/56

USPC ................................ 714/718, 711, 720, 722
See application file for complete search history.

(56) References Cited

U.S. PATENT DOCUMENTS

| | | | | | |
|---|---|---|---|---|---|
| 4,569,048 | A | * | 2/1986 | Sargent | G06F 11/261 714/29 |
| 4,873,705 | A | * | 10/1989 | Johnson | G06F 11/261 714/719 |
| 4,875,210 | A | * | 10/1989 | Russo | G01R 31/31921 714/743 |
| 5,381,087 | A | * | 1/1995 | Hirano | G01R 31/31832 324/73.1 |
| 5,673,388 | A | * | 9/1997 | Murthi | G11C 29/26 714/42 |
| 5,805,611 | A | * | 9/1998 | McClure | G01R 31/30 327/116 |
| 5,951,702 | A | * | 9/1999 | Lim | G11C 29/04 365/200 |

(Continued)

*Primary Examiner* — Fritz Alphonse
(74) *Attorney, Agent, or Firm* — McDonnell Boehnen Hulbert & Berghoff LLP

(57) ABSTRACT

The present invention provides a method for read/write speed testing, comprising: obtaining a test speed of reading data from or writing data to each of a plurality of memories, the plurality of memories including a random access memory and at least one buffer memory associated with the random access memory; and determining an actual speed of reading data from or writing data to the random access memory according to the test speed of reading data from or writing data to the each memory. Embodiments of the present invention further disclose an apparatus for read/write speed testing and electronic device. With the embodiments of the present invention, the read/write speed of the random access memory can be tested more accurately.

17 Claims, 3 Drawing Sheets obtaining a test speed of reading data from or writing data to each of a plurality of memories — S101 determining an actual speed of reading data from or writing data to the random access memory according to the test speed of reading data from or writing data to the each memory — S102

(56) References Cited

U.S. PATENT DOCUMENTS 6,119,257 A * 9/2000 Negishi ............ G01R 31/31919
　　　　　　　　　　　　　　　　　　　714/738

* cited by examiner

METHOD, APPARATUS AND ELECTRONIC DEVICE FOR READ/WRITE SPEED TESTING

CROSS REFERENCE TO RELATED APPLICATION

The present application claims the priority to a Chinese patent application No. 201711372642.4, filed with the State Intellectual Property Office of the People's Republic of China on Dec. 19, 2017 and entitled "Method, Apparatus and Electronic Device for Read/Write Speed Testing", which is hereby incorporated into the present application by reference in its entirety.

TECHNICAL FIELD

The present invention relates to the field of electronic technology, and particularly to a method, apparatus, and electronic device for read/write speed testing.

BACKGROUND

With the popularity of smart mobile phones, there are more and more mobile phone manufacturers. Manufacturers supplying Central Processing Units (CPUs) and random access memories include Samsung, Qualcomm, Intel, Huawei, Hynix and Micron. The operating speed of a mobile phone depends on the read/write speed of a random access memory and CPU buffer memories. However, the variety of sources and types of random access memories and CPU buffer memories makes it difficult for a user to select a mobile phone with superior performance. When testing and evaluating the read/write speed of a random access memory in the prior art, only the read/write speed of the random access memory is tested without taking the impact of the CPU buffer memory on the read/write speed of the random access memory into account, causing the test result cannot accurately indicate the actual read/write speed of the random access memory.

SUMMARY

Embodiments of the present invention provide a method, an apparatus, and an electronic device for read/write speed testing, by means of which the read/write speed of a random access memory can be more accurately tested.

A first aspect of the present invention provides a method for read/write speed testing, comprising:

obtaining a test speed of reading data from or writing data to each of a plurality of memories, the plurality of memories including a random access memory and at least one buffer memory associated with the random access memory; and determining an actual speed of reading data from or writing data to the random access memory according to the test speed of reading data from or writing data to the each memory.

Determining an actual speed of reading data from or writing data to the random access memory according to test speed of reading data from or writing data to the each memory comprises:

calculating a weighted average value of test speeds of reading data from or writing data to the plurality of memories; and determining the weighted average value as the actual speed of reading data from or writing data to the random access memory.

Obtaining a test speed of reading data from or writing data to each of the plurality of memories comprises:

performing a plurality of tests on each of the memories to obtain a test result of each test; and determining an average value of test results of the plurality of tests as the test speed of reading data from or writing data to the memory.

Obtaining a test result of each test comprises:

obtaining a data size for a test for the each memory, and duration for reading data of the data size from or writing data of the data size to the memory; and determining the test result of the each test for the each memory according to the data size and the duration.

Determining a test result of the each test for the each memory according to the data size and the duration comprises:

determining a value obtained by dividing the data size by the duration as the test result of the each test for the each memory.

Obtaining a test result of the each test comprises:

performing a test simultaneously on the each memory using two threads;

obtaining a test speed component obtained by each of the two threads; and determining a sum of the test speed components obtained by the two threads as the test result of the each memory.

The two threads use a thread lock.

Correspondingly, a second aspect of the present invention provides an apparatus for read/write speed testing, comprising:

a test speed obtaining module configured to obtain a test speed of reading data from or writing data to each of a plurality of memories, the plurality of memories including a random access memory and at least one buffer memory associated with the random access memory; and an actual speed calculating module configured to determine an actual speed of reading data from or writing data to the random access memory according to the test speed of reading data from or writing data to the each memory.

The actual speed calculating module is specifically configured to:

calculate a weighted average value of test speeds of reading data from or writing data to the plurality of memories; and determine the weighted average value as the actual speed of reading data from or writing data to the random access memory.

The test speed obtaining module is specifically configured to:

perform a plurality of tests on each of the memories to obtain a test result of each test; and determine an average value of test results of the plurality of tests as the test speed of reading data from or writing data to the memory.

The test speed obtaining module is specifically configured to:

obtain a data size for a test for the each memory, and duration for reading data of the data size from or writing data of the data size to the memory; and determine the test result of the test of the each memory according to the data size and the duration.

The test speed obtaining module is specifically configured to:

determine a value obtained by dividing the data size by the duration as the test result of the test of the each memory.

The test speed obtaining module is specifically configured to:

perform a test simultaneously on the each memory using two threads;

obtain a test speed component obtained by each of the two threads; and determine a sum of the test speed components obtained by the two threads as the test result of the each memory.

The two threads use a thread lock.

Correspondingly, a third aspect of the present invention provides an electronic device, comprising: a processor, a memory, a communication interface and a bus;

the processor, the memory and the communication interface are connected and communicated with each other via the bus;

the memory stores executable program code; and the processor executes a program corresponding to the executable program code by reading the executable program code stored in the memory, to obtain a test speed of reading data from or writing data to each of a plurality of memories, the plurality of memories including a random access memory and at least one buffer memory associated with the random access memory; and determine an actual speed of reading data from or writing data to the random access memory according to the test speed of reading data from or writing data to the each memory.

Correspondingly, an embodiment of the present invention provides a storage medium, used for storing an application, and the application is configured to, when being executed, perform the method for read/write speed testing disclosed by the first aspect of the embodiments of the present invention.

Correspondingly, an embodiment of the present invention provides an application, wherein the application is configured to, when being executed, perform the method for read/write speed testing disclosed by the first aspect of the embodiments of the present invention.

In the embodiments of the present invention, first the test speed of reading data from or writing data to each of the plurality of memories is obtained, wherein the plurality of memories include a random access memory and at least one buffer memory associated with the random access memory; and an actual speed of reading data from or writing data to the random access memory is determined according to the test speed of reading data from or writing data to the each memory. The impact of the buffer memory on the speed of reading data from or writing data to the random access memory is fully taken into account, and the impact is embodied in a final test result for the speed of reading data from or writing data to the random access memory by setting the weights and calculating a weighted average value. Therefore, the accuracy of testing the speed of reading data from or writing data to the random access memory is improved.

BRIEF DESCRIPTION OF THE DRAWINGS

Figures used in the embodiments are described briefly below to more clearly illustrate technical solutions of the embodiments of the present invention. Obviously, the figures described below are for only some embodiments of the present invention. Those skilled in the art can obtain other figures based on these figures without any creative efforts.

DETAILED DESCRIPTION

Technical solutions in the embodiments of the present invention will be described clearly and completely with reference to figures in embodiments of the present invention. Obviously, embodiments described herein are for only some embodiments of the present invention. Other embodiments obtained by those having ordinary skill in the art, based on the embodiments of the present invention without any creative efforts, fall within the extent of protection of the present invention.

Figure 1:
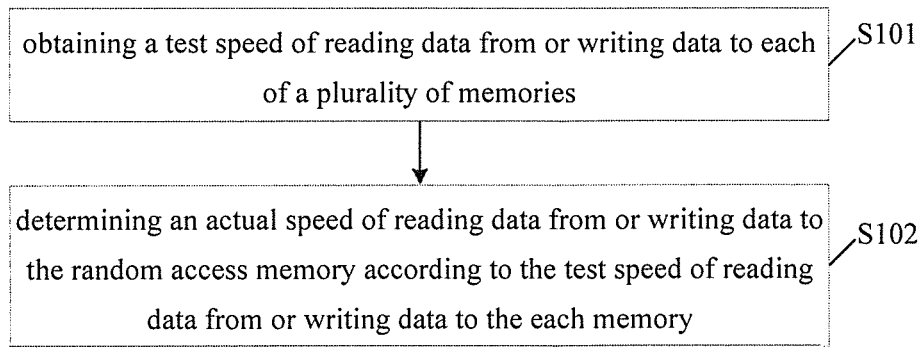
FIG. 1 is a flow chart of a method for read/write speed testing according to an embodiment of the present invention.

FIG. 1 is a flow chart of a method for read/write speed testing according to an embodiment of the present invention. As shown in FIG. 1, the method of the embodiment of the present invention comprises:

S101: obtaining a test speed of reading data from or writing data to each of a plurality of memories.

In a specific implementation, the plurality of memories can include a random access memory and at least one buffer memory associated with the random access memory. The buffer memory associated with the random access memory can be a cache, which includes a first-level cache memory (L1), a second-level cache memory (L2) and a third-level cache memory (L3). The read/write speed of the cache is higher than the read/write speed of the random access memory, and the read/write speed of L1 is higher than that of L2 and L3. While a CPU writes data to or reads data from the random access memory, it writes the data into the cache for caching. When the CPU needs the data stored in the random access memory, it first checks whether the data is in the cache. If the data needed is in the cache, the CPU directly reads the data from the cache without accessing to the random access memory which has a lower read/write speed; and if the data needed is not in the cache, the CPU reads the data needed from the random access memory.

Figure 2:
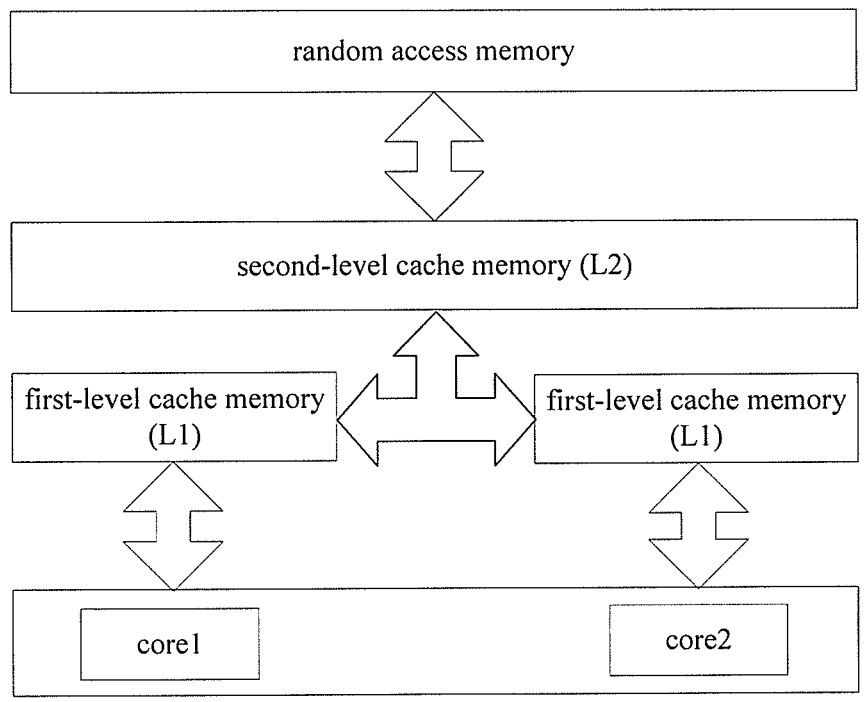
FIG. 2 is a schematic diagram of an association between a random access memory and buffer memories according to an embodiment of the present invention.

For example, FIG. 2 is a schematic diagram of a association between the random access memory and buffer memories according to an embodiment of the present invention. As shown in the figure, the CPU has two cores, namely Core1 and Core2, and two levels of caches L1 and L2. Core1 and Core2 each has an L1 and they share L2. The L1s and L2 together serve as temporary memories between the CPU and the random access memory. While the CPU writes data into the random access memory, the data are also written into the L1s and L2. When the CPU needs data in the random access memory, it searches for the data first in the L1s, and then L2, and finally the random access memory until the data needed are found. If the data needed are finally found in the random access memory, the CPU writes the data needed into the L1s and L2 while reading the data.

The memories are tested one by one to obtain a test speed of reading data from or writing data to each of the memories. Each of the memories is tested by a same testing method, which comprises the following steps:

1. Obtaining a data size for a test for a memory. The data size determines a total quantity of data to be written into the memory and a total quantity of data to be read from the memory for completing the test, wherein the total quantity of the data to be written is the same as the total quantity of the data to be read, and the data size can be any value such as 16 M or 10 M.

2. Setting a size of a testing unit. The data size is an integral multiple of the size of the testing unit. For example, if the data size is set to 16 M, the size of the testing unit can be set to 8 K.

3. Requesting from the memory for a continuous storage space having the same size as the testing unit, determining the address of the continuous storage space as a source address; and then requesting from one of the plurality of memories for another continuous storage space having the same size as the testing unit, and determining the address of the other continuous storage space as a destination address. For example, when L1 is tested, it is possible to request from L1 for a 8 K continuous storage space, and determine the address of the 8 K continuous storage space as the source address; and then request from L1 for another 8 K continuous storage space, and determine the address of the other 8 K continuous storage space as the destination address. If the storage space of L1 is less than 16 K, i.e., the source address and the destination address cannot be in the same memory L1, another 8 K continuous storage space is requested from L2 and the address of this 8 K continuous storage space is determined as the destination address. When L2 is tested, it is possible to request from L2 for a 128 K continuous storage space, and determine the address of the 128 K continuous storage space as the source address; and then request from L2 for another 128 K continuous storage space, and determine the address of the other 128 K continuous storage space as the destination address. If the storage space of L2 is less than 256 K, i.e., the source address and the destination address cannot be in the same memory L2, another 128 K continuous storage space is requested from the random access memory (RAM) and the address of this 128 K continuous storage space is determined as the destination address.

4. Writing a data block having a same size as the testing unit to the continuous storage space to which the source address is directed, and then reading all data from the source address into the continuous storage space to which the destination address is directed. Such a write-and-read process is called a testing cycle.

5. Obtaining a value N by dividing the data size by the size of the testing unit; repeatedly performing the testing cycle N times, wherein a process from the start of the first testing cycle to the end of the $N^{th}$ testing cycle is called an effective test; and recording the duration for completing one effective test.

6. Determining a value obtained by dividing the data size by the duration as a test result of the effective test for the memory, and determining the test result as a test speed of the memory.

It should be noted that the data size and the size of the testing unit may vary with respect to the test of the random access memory and the buffer memories.

For example, the current testing target is the random access memory. The size of the testing unit for testing the random access memory is set to 8 K and the data size is set to 16 M. First, a 8 K continuous storage space is requested from the random access memory, and the address of the continuous storage space is determined as the source address. Another 8 K continuous storage space is then requested from storage media other than the random access memory, and the address of the other continuous storage space is determined as the destination address. A testing cycle includes writing 8 K random floating point numbers to the continuous storage space to which the source address is directed, and copying all data stored in the storage space to which the source address is directed, by using the memcpy function, to the storage space to which the destination address is directed. The memcpy is a function of C/C++ programming language for copying memory blocks, and it can copy any content stored in the storage space to which the source address is directed to the storage space to which the destination address is directed. The number of times 2048 for repeatedly performing the testing cycle is obtained by dividing 16 M by 8 K. If the duration for performing 2048 testing cycles is t microsecond (µs), the test result of this effective test is 16/t M/µs, and the test speed of the random access memory is 16/t M/µs. To convert the measurement unit of the test speed into G/s, the test speed can be multiplied by 1000000 and divided by 1024.

Optionally, each of the memories can be tested for a plurality of times within a period of time by using the testing method comprising the steps 1-6 described above. The number of times of effective tests and the test result of each of the effective tests are recorded. An average value of the test results of the effective tests is determined as the test speed of the memory. The period of time can be any period of time, such as 5 s or 10 s.

For example, the random access memory is tested for a plurality of times within 5 s, three effective tests are completed within the 5 s, and the test results of the three effective tests are $16/t_1$, $16/t_2$, and $16/t_3$. The test speed of the random access memory is determined by calculating an average value of the three test results $(16/t_1+16/t_2+16/t_3)/3$ M/µs. To convert the measurement unit of the test speed into G/s, the test speed can be multiplied by 1000000 and divided by 1024.

S102: determining an actual speed of reading data from or writing data to the random access memory according to the test speed of reading data from or writing data to the each memory.

In a specific implementation, it is possible to calculate a weighted average value of the test speeds of reading data from or writing data to the plurality of memories, and the weighted average value is determined as the actual speed of reading data from or writing data to the random access memory. A weight of the test speed of each of the memories can be determined according to the test speed and a sum of weights of the memories does not exceed the number of the memories.

For example, there are three memories: a random access memory, a first-level cache memory and a second-level cache memory, whose test speeds are respectively 10 G/s, 100 G/s, and 60 G/s; and weights of those test speeds are respectively set to 1.2, 0.6 and 0.8 according to a rule that the higher the test speed is, the lower the weight will be, and that the sum of the weights does not exceed 3. The actual speed of reading data from or writing data to the random access memory is:

(10*1.2+100*0.6+60*0.8)/(1.2+0.6+0.8)=46.2 G/s

Optionally, an average value of the test speeds of reading data from or writing data to the memories can be calculated, and the average value is determined as the actual speed of reading data from or writing data to the random access memory.

For example, there are three memories: a random access memory, a first-level cache memory and a second-level cache memory, whose test speeds are respectively 10 G/s, 100 G/s, and 60 G/s. Thereby, the actual speed of reading data from or writing data to the random access memory is:

(10+100+60)/3=56.7 G/s

In the embodiment of the present invention, first the test speed of reading data from or writing data to each of the plurality of memories is obtained, wherein the plurality of memories include a random access memory and at least one buffer memory associated with the random access memory; and an actual speed of reading data from or writing data to the random access memory is determined according to the test speed of reading data from or writing data to the each memory. The impact of the buffer memory on the speed of reading data from or writing data to the random access memory is fully taken into account, and the impact is embodied in a final test result of the speed of reading data from or writing data to the random access memory by setting the weights and calculating a weighted average value. Therefore, the accuracy of testing the speed of reading data from or writing data to the random access memory is improved.

Figure 3:
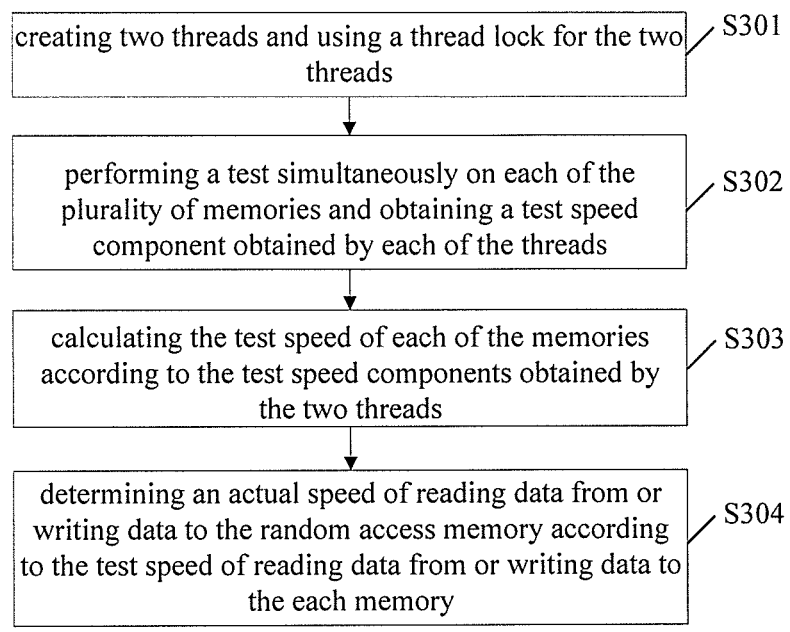
FIG. 3 is a flow chart of another method for read/write speed testing according to an embodiment of the present invention.

FIG. 3 is a flow chart of another method for read/write speed testing according to an embodiment of the present invention. As shown in the figure, the method in the embodiment of the present invention comprises:

S301: creating two threads and using a thread lock for the two threads.

In a specific implementation, the threads can be created by using a thread creating function of a computer programming language. For example, in Linux/Unix operating system, the pthread_creat function can be used to create the threads. Moreover, to ensure operations of the two threads do not impact each other, a thread lock, for example a mutex lock, is used for the two threads. When one thread writes data to or reads data from a memory, the mutex lock can prevent the other thread from accessing these data.

S302: using the two threads to simultaneously test each of the plurality of memories and obtaining a test speed component obtained by each of the threads.

In a specific implementation, the plurality of memories can include a random access memory and at least one buffer memory associated with the random access memory. The buffer memory associated with the random access memory can be a cache, which includes a first-level cache memory (L1), a second-level cache memory (L2) and third-level cache memory (L3). The read/write speed of the cache is higher than the read/write speed of the random access memory, and the read/write speed of L1 is higher than that of L2 and L3. While a CPU writes data to or reads data from the random access memory, it writes the data to the cache for caching. When the CPU needs data stored in the random access memory, it first checks whether the data is in the cache. If the data needed is in the cache, the CPU directly reads the data needed from the cache without accessing to the random access memory which has a lower read/write speed; if the data needed is not in the cache, the CPU reads the data needed from the random access memory.

For example, FIG. 2 is a schematic diagram of an association between the random access memory and buffer memories according to an embodiment of the present invention. As shown in the figure, the CPU has two cores, namely Core1 and Core2, and two levels of caches L1 and L2. Core1 and Core2 each has an L1 and they share L2. The L1s and L2 together serve as temporary memories between the CPU and the random access memory. When the CPU writes data into the random access memory, the data are written into the L1s and L2. When the CPU needs data in the random access memory, it searches for the data first in L1, and then L2, and finally the random access memory until the data needed are found. If the data needed are finally found in the random access memory, the CPU writes the data needed into the L1s and L2 while reading the data.

In the two threads, each of the memories is tested to obtain a testing speed component obtained by each thread. The two threads perform a same testing operation, and test each of the memories by using a same testing method, which comprises the following steps:

1. Obtaining a data size for a test for a memory. The data size determines a total quantity of data to be written into the memory and a total quantity of data to be read from the memory for completing each test, wherein the total quantity of the data to be written is the same as the total quantity of the data to be read, and the data size can be any value such as 16 M or 10 M.

2. Setting a size of a testing unit. The data size is an integer multiple of the size of the testing unit. For example, if the data size is set to 16 M, the size of the testing unit can be set to 8 K.

3. Requesting from the memory for a continuous storage space having the same size as the testing unit, determining the address of the continuous storage space as a source address; and then requesting from one of the plurality of memories for another continuous storage space having the same size as the testing unit, and determining the address of the other continuous storage space as a destination address. For example, when L1 is tested, it is possible to request from L1 for a 8 K continuous storage space, and determine the address of the 8 K continuous storage space as the source address; and then request from L1 for another 8 K continuous storage space, and determine the address of the other 8 K continuous storage space as the destination address. If the storage space of L1 is less than 16 K, i.e., the source address and the destination address cannot be in the same memory L1, another 8 K continuous storage space is requested from L2 and the address of this 8 K continuous storage space is determined as the destination address. When L2 is tested, it is possible to request from L2 for a 128 K continuous storage space, and determine the address of the 128 K continuous storage space as the source address; and then request from L2 for another 128 K continuous storage space, and determine the address of the other 128 K continuous storage space as the destination address. If the storage space of L2 is less than 256 K, i.e., the source address and the destination address cannot be in the same memory L2, another 128 K continuous storage space is requested from the random access memory (RAM) and the address of this 128 K continuous storage space is determined as the destination address.

4. Writing a data block having a same size as the testing unit to the continuous storage space to which the source address is directed, and then reading all data from the source address into the continuous storage space to which the destination address is directed. Such a write-and-read process is called a testing cycle.

5. Obtaining a value N by dividing the data size by the size of the testing unit; repeatedly performing the testing cycle N times, wherein a process from the start of the first testing cycle to end of the $N^{th}$ testing cycle is called an effective test; and recording the duration for completing one effective test.

6. Determining a value obtained by dividing the data size by the duration as a test speed component of the effective test for the memory.

It should be noted that the data size and the size of the testing unit may vary with respect to the test of the random access memory and the buffer memories.

For example, the current testing target is the random access memory. Thread 1 and thread 2 are created, and the size of the testing unit for testing the random memory is set to 8 K and the data size is set to 16 M. During thread 1, a 8 K continuous storage space is first requested from the random access memory, and the address of the continuous storage space is determined as the source address. Another 8 K continuous storage space is then requested from storage media other than the random access memory, and the address of the other continuous storage space is determined as the destination address. A testing cycle includes writing 8 K random floating point numbers to the continuous storage space to which the source address is directed, and copying all data stored in the storage space to which the source address is directed, by using the memcpy function, to the storage space to which the destination address is directed. The memcpy is a function of C/C++ programming language for copying memory blocks, and it can copy any content stored in the storage space to which the source address is directed to the storage space to which the destination address is directed. The number of times 2048 for repeatedly performing the testing cycle is obtained by dividing 16 M by 8 K. If the duration for performing 2048 testing cycles is t microsecond (µs), the test speed component of this effective test is $16/t$ M/µs. Likewise, the test speed component of an effective test performed by the thread 2 can be obtained.

Optionally, it is possible to use the two threads to perform a plurality of tests on each of the memories within a period of time by using the testing method comprising the steps 1-6 described above. The number of times of effective tests performed by each of the threads and the test speed component of each of the effective tests are recorded.

For example, the random access memory is tested by the thread 1, and three effective tests are completed within 5 s, the test speed components of the effective tests performed by the thread 1 are $16/t_1$, $16/t_2$, and $16/t_3$. Likewise, it is possible to obtain the number of times of effective tests performed by the thread 2 within 5 s and obtain the test speed component of each of the effective tests.

S303: calculating the test speed of each of the memories according to the test speed components obtained by the two threads.

In a specific implementation, a sum of the test speed components obtained by the two threads can be determined as the test speed of each of the memories.

For example, the current testing target is the random access memory, the test speed component obtained by the thread 1 is $16/t_1$, and the test speed component obtained by the thread 2 is $16/T_1$. A sum of the test results of the two threads is calculated as $V=16/t_1+16/T_1$, and V is determined as the test speed of the random access memory.

Optionally, for each thread, an average value of test speed components obtained by performing a plurality of effective tests is determined as a test result of a thread. The sum of test results of the two threads is determined as the test speed of the memory.

For example, the current testing target is the random access memory, three effective tests are performed by the thread 1 within 5 s, and test speed components of the effective tests are respectively $16/t_1$, $16/t_2$, and $16/t_3$. An average value of the test speed components of the three effective tests is $V_1=(16/t_1+16/t_2+16/t_3)/3$, and $V_1$ is determined as the test result of the thread 1. Three effective tests are performed by the thread 2 within 5 s, and test speed components of the effective tests are respectively $16/T_1$, $16/T_2$ and $16/T_3$. An average value of the test speed components of the three effective tests is $V_2=(16/T_1+16/T_2+16/T_3)/3$, and $V_2$ is determined as a test result of the thread 2. Thus, the test speed of the random access memory is determined as a sum of the test results of the two threads $V_1+V_2$.

Optionally, a sum of test speed components obtained by the two threads in each effective test is determined as a test result of the memory for this effective test, and an average value of test results of a plurality of effective tests is determined as the test speed of the memory.

For example, the current testing target is the random access memory, three effective tests are performed by the thread 1 within 5 s, and test speed components of the effective tests are $16/t_1$, $16/t_2$, and $16/t_3$; three effective tests are performed by the thread 2 within 5 s, and test speed components of the effective tests are $16/T_1$, $16/T_2$, and $16/T_3$. Sums of test speed components obtained in the effective tests performed by the two threads are $V_1=16/t_1+16/T_1$, $V_2=16/t_2+16/T_2$, and $V_3=16/t_3+16/T_3$, wherein $V_1$, $V_2$ and $V_3$ are the respective test result of the first effective test, of the second effective test, and of the third effective test. Thereby, an average value $(V_1+V_2+V_3)/3$ of the three test results is determined as the test speed of the random access memory.

S304: determining an actual speed of reading data from or writing data to the random access memory according to the test speed of reading data from or writing data to the each memory.

In a specific implementation, it is possible to calculate a weighted average value of the test speeds of reading data from or writing data to the plurality of memories, and the weighted average value is determined as the actual speed of reading data from or writing data to the random access memory. A weight of the test speed for each of the memories can be determined according to the test speed, and a sum of weights of the memories does not exceed the number of the memories.

For example, there are three memories: a random access memory, a first-level cache memory and a second-level cache memory, whose test speeds are respectively 10 G/s, 100 G/s, 60 G/s; and weights for those test speeds are respectively set to 1.2, 0.6 and 0.8 according to a rule that the higher the test speed is, the lower the weight will be, and that the sum of the weights does not exceed 3. The actual speed of reading data or writing data to the random access memory is:

(10*1.2+100*0.6+60*0.8)/(1.2+0.6+0.8)=46.2 G/s

Optionally, an average value of the test speeds of reading data from or writing data to the memories can be calculated, and the average value is determined as the actual speed of reading data from or writing data to the random access memory.

For example, there are three memories: a random access memory, a first-level cache memory and a second-level cache memory, whose test speeds are respectively 10 G/s, 100 G/s, 60 G/s. Thereby, the actual speed of reading data from or writing data to the random access memory is:

(10+100+60)/3=56.7 G/s

In the embodiment of the present invention, first the test speed of reading data from or writing data to each of the plurality of memories is obtained, wherein the plurality of memories include a random access memory and at least one buffer memory associated with the random access memory; and an actual speed of reading data from or writing data to the random access memory is determined according to the test speed of reading data from or writing data to the each memory. The impact of the buffer memory on the speed of reading data from or writing data to the random access memory is fully taken into account, and the impact is embodied in a final test result of the speed of reading data from or writing data to the random access memory by setting the weights and calculating a weighted average value. Therefore, the accuracy of testing the speed of reading data from or writing data to the random access memory is improved.

Figure 4:
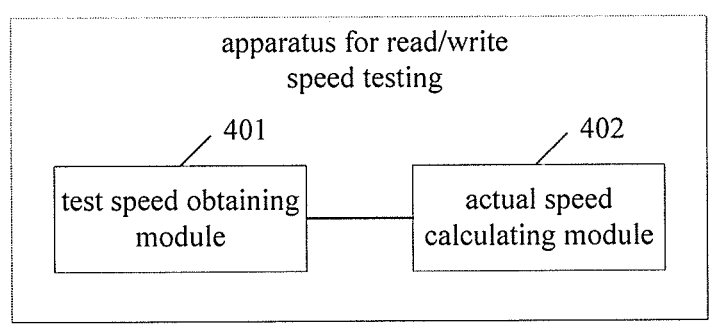
FIG. 4 is a structural schematic diagram of an apparatus for read/write speed testing according to an embodiment of the present invention.

FIG. 4 is a structural schematic diagram of an apparatus for read/write speed testing according to an embodiment of the present invention. As shown in the figure, the apparatus in the embodiment of the present invention comprises:

a test speed obtaining module 401, configured to obtain a test speed of reading data from or writing data to each of a plurality of memories, wherein the plurality of memories include a random access memory and at least one buffer memory associated with the random access memory.

In a specific implementation, the buffer memory associated with the random access memory can be a cache, which includes a first-level cache memory (L1), a second-level cache memory (L2) and third-level cache memory (L3). The read/write speed of the cache is higher than the read/write speed of the random access memory, and the read/write speed of L1 is higher than that of L2 and L3. While a e CPU writes data to or read data from the random access memory, it writes the data into the cache for caching. When the CPU needs data stored in the random access memory, it first checks whether the data is in the cache. If the data needed is in the cache, the CPU directly reads the data needed from the cache without accessing to the random access memory which has a lower read/write speed; and if the data needed is not in the cache, the CPU reads the data needed from the random access memory.

For example, FIG. 2 is a schematic diagram of a association between the random access memory and buffer memories according to an embodiment of the present invention. As shown in the figure, the CPU has two cores, namely Core1 and Core2, and two levels of caches L1 and L2. Core1 and Core2 each has an L1 and they share L2. The L1s and L2 together serve as temporary memories between the CPU and the random access memory. When the CPU writes data into the random access memory, the data are also written into the L1s and L2. When the CPU needs data in the random access memory, it searches for the data first in the L1s, and then L2, and finally the random access memory until the data needed are found. If the data needed are finally found in the random access memory, the CPU writes the data needed into the L1s and L2 while reading the data.

The memories are tested one by one to obtain a test speed of reading data from or writing data to each of the memories. Each of the memories is tested by a same testing method, which comprises the following steps:

1. Obtaining a data size for a test for a memory. The data size determines a total quantity of data to be written into the memory and a total quantity of data to be read from the memory for completing the test, wherein the total quantity of the data to be written is the same as the total quantity of the data to be read, and the data size can be any value such as 16 M or 10 M.

2. Setting a size of a testing unit. The data size is an integral multiple of the size of the testing unit. For example, if the data size is set to 16 M, the size of the testing unit can be set to 8 K.

3. Requesting from the memory for a continuous storage space having the same size as the testing unit, determining the address of the continuous storage space as a source address; and then requesting from one of the plurality of memories for another continuous storage space having the same size as the testing unit, and determining the address of the other continuous storage space as a destination address. For example, when L1 is tested, it is possible to request from L1 for a 8 K continuous storage space, and determine the address of the 8 K continuous storage space as the source address; and then request from L1 or L2 for another 8 K continuous storage space, and determine the address of the other 8 K continuous storage space as the destination address.

4. Writing a data block having a same size as the testing unit to the continuous storage space to which the source address is directed, and then reading all data from the source address into the continuous storage space to which the destination address is directed. Such a write-and-read process is called as a testing cycle.

5. Obtaining a value N by dividing the data size by the size of the testing unit; repeatedly performing the testing cycle N times, wherein a process from the start of the first testing cycle to the end of the $N^{th}$ testing cycle is called an effective test; and recording the duration for completing one effective test.

6. Determining a value obtained by dividing the data size by the duration as a test result of the effective test for the memory, and determining the test result as a test speed of the memory.

It should be noted that the data size and the size of the testing unit may vary with respect to the test of the random access memory and the buffer memories.

For example, the current testing target is the random access memory. The size of the testing unit for testing the random access memory is set to 8 K and the data size is set to 16 M. First, a 8K continuous storage space is requested from the random access memory, and the address of the continuous storage space is determined as the source address. Another 8 K continuous storage space is then requested from storage media other than the random access memory, and the address of the other continuous storage space is determined as the destination address. A testing cycle includes writing 8 K random floating point numbers to the continuous storage space to which the source address is directed, and copying all data stored in the storage space to which the source address is directed, by using the memcpy function, to the storage space to which the destination address is directed. The memcpy is a function of C/C++ programming language for copying memory blocks, and it can copy any content stored in the storage space to which the source address is directed, to the storage space to which the destination address is directed. The number of times 2048 for repeatedly performing the testing cycle is obtained by dividing 16 M by 8 K. If the duration for completing 2048 testing cycles is t microsecond (µs), the test result of third effective test is 16/t M/µs, and the test speed of the random access memory is 16/t M/µs. To convert the measurement unit of the test speed into G/s, the test speed can be multiplied by 1000000 and divided by 1024.

Optionally, each of the memories can be tested for a plurality of times within a period of time by using the testing method comprising the steps 1-6 described above. The number of times of effective tests and the test result of each of the effective tests are recorded. An average value of the test results of the effective tests is determined as the test speed of the memory. The period of time can be any period of time such as 5 s or 10 s.

For example, the random access memory is tested for a plurality of times within 5 s, three effective tests are completed within the 5 s, and the test results of the three effective tests are $16/t_1$, $16/t_2$, and $16/t_3$. The test speed for the random access memory is determined by calculating an average value of the three test results $(16/t_1+16/t_2+16/t_3)/3$ M/μs. To convert the measurement unit of the test speed into G/s, the test speed can be multiplied by 1000000 and divided by 1024.

Optionally, two threads can be used to perform tests on each of the memories to obtain a test speed component obtained by each thread. The two threads perform a same testing operation, and test the memories by using a same testing method, which comprises the steps 1-6 described above. A value obtained by dividing the data size by the duration as calculated in the step 6 is determined as the test speed component of an effective test of each thread, and a sum of test speed components obtained by the two threads is determined as the test speed of the memory.

For example, the current testing target is the random access memory, the test speed component obtained by the thread 1 is $16/t_1$, and the test speed component obtained by the thread 2 is $16/T_1$. A sum of the test results of the two threads is calculated as $V=16/t_1+16/T_1$, and V is determined as the test speed of the random access memory.

Optionally, it is possible to use two threads to perform a plurality of tests on each of the memories within a period of time by using the testing method comprising the steps 1-6 described above. A value obtained by dividing the data size by the duration as calculated in the step 6 is determined as the test speed component of an effective test of each thread, and the number of effective tests completed by each thread within a period of time and the test speed component of each of the effective tests are recorded. For each thread, an average value of test speed components of a plurality of effective tests is determined as a test result of the thread, and a sum of test results of the two threads is determined as the test speed of each of the memories.

For example, the current testing target is the random access memory, three effective tests are performed by the thread 1 within 5 s, and test speed components of the effective tests are respectively $16/t_1$, $16/t_2$, and $16/t_3$. An average value of the test speed components of the three effective tests is $V_1=(16/t_1+16/t_2+16/t_3)/3$, and $V_1$ is determined as the test result of the thread 1. Three effective tests are performed by the thread 2 within 5 s, and test speed components of the effective tests are respectively $16/T_1$, $16/T_2$ and $16/T_3$. An average value of the test speed components of the three effective tests is $V_2=(16/T_1+16/T_2+16/T_3)/3$, and $V_2$ is determined as a test result of the thread 2. Thus, the test speed of the random access memory is determined as a sum of the test results of the two threads $V_1+V_2$.

Further optionally, a sum of test speed components obtained by the two threads in each effective test is determined as a test result of the memory for this effective test, and an average value of test results of a plurality of effective tests is determined as the test speed of the memory.

For example, the current testing target is the random access memory, three effective tests are performed by the thread 1 within 5 s, and test speed components of the effective tests are $16/t_1$, $16/t_2$, and $16/t_3$; three effective tests are performed by the thread 2 within 5 s, and test speed components of the effective tests are $16/T_1$, $16/T_2$ and $16/T_3$. First sums of test speed components obtained in the effective tests performed by the two threads are $V_1=16/t_1+16/T_1$, $V_2=16/t_2+16/T_2$, $V_3=16/t_3+16/T_3$, wherein $V_1$, $V_2$ and $V_3$ are the respective test result of the first effective test, of the second effective test, and of the third effective test. Thereby, an average value $(V_1+V_2+V_3)/3$ of the three test results is determined as the test speed of the random access memory.

An actual speed calculating module 402 is configured to determine an actual speed of reading data from or writing data to the random access memory according to the test speed of reading data from or writing data to the each memory.

In a specific implementation, it is possible to calculate a weighted average value of the test speeds of reading data from or writing data to the plurality of memories, and the weighted average value is determined as the actual speed of reading data from or writing data to the random access memory. A weight of the test speed for each of the memories can be determined according to the test speed, and a sum of weights for the memories does not exceed the number of the memories.

For example, there are three memories: a random access memory, a first-level cache memory and a second-level cache memory, whose test speeds are respectively 10 G/s, 100 G/s, 60 G/s; and weights for those test speeds are respectively set to 1.2, 0.6 and 0.8 according to a rule that the higher the test speed is, the lower the weight will be, and that the sum of the weights does not exceed 3. The actual speed of reading data from or writing data to the random access memory is:

(10*1.2+100*0.6+60*0.8)/(1.2+0.6+0.8)=46.2 G/s

Optionally, an average value of the test speeds of reading data from or writing data to the memories can be calculated, and the average value is determined as the actual speed of reading data from or writing data to the random access memory.

For example, there are three memories: a random access memory, a first-level cache memory and a second-level cache memory, whose test speeds are respectively 10 G/s, 100 G/s, and 60 G/s. Thereby, the actual speed of reading data from or writing data to the random access memory is:

(10+100+60)/3=56.7 G/s

In the embodiment of the present invention, first the test speed of reading data from or writing data to each of the plurality of memories is obtained, wherein the plurality of memories include a random access memory and at least one buffer memory associated with the random access memory; and an actual speed of reading data from or writing data to the random access memory is determined according to the test speed of reading data from or writing data to the each memory. The impact of the buffer memory on the speed of reading data from or writing data to the random access memory is fully taken into account, and the impact is embodied in a final test result of the speed of reading data from or writing data to the random access memory by setting the weights and calculating a weighted average value. Therefore, the accuracy of testing the speed of reading data from or writing data to the random access memory is improved.

Figure 5:
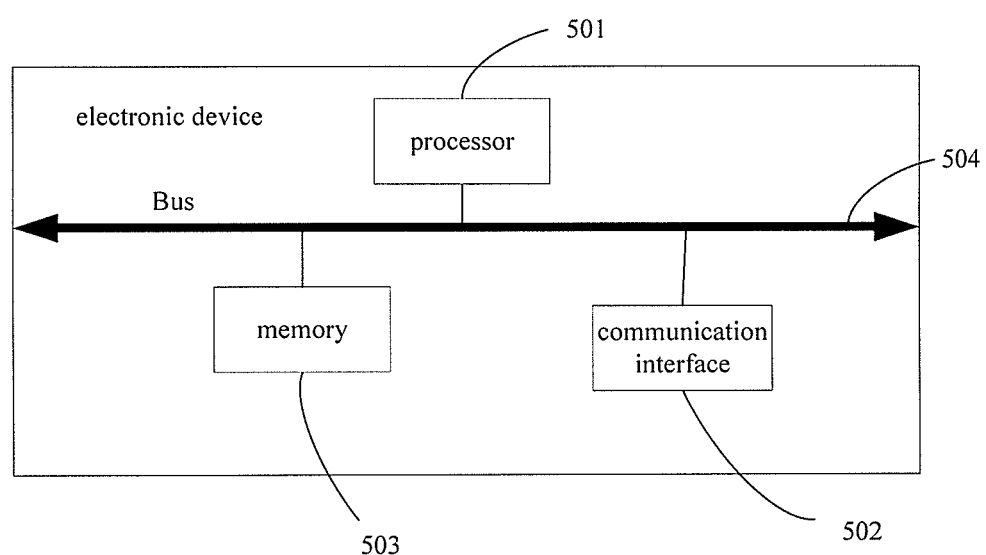
FIG. 5 is a structural schematic diagram of an electronic device according to an embodiment of the present invention.

FIG. 5 is a structural schematic diagram of an electronic device according to an embodiment of the present invention. As shown in the figure, the electronic device can comprise: at least one processor 501 such as a CPU, at least one communication interface 502, at least one memory 503 and at least one bus 504, wherein these components communicate with each other via the bus 504. The communication interface 502 of the electronic device in the embodiment of the present invention is a wired transmission port or a wireless device, e.g., such as an antenna device, for communicating signaling or data with other node devices. The memory 503 may be a high-speed memory RAM or a non-volatile memory, for example at least one magnetic disk memory. Optionally, the memory 503 may also be at least one storage device located away from the processor 501. A set of computer code is stored in the memory 503, and the processor 501 is used to invoke the computer code stored in the memory to perform the following operations:

obtaining a test speed of reading data from or writing data to each of a plurality of memories, wherein the plurality of memories include a random access memory and at least one buffer memory associated with the random access memory; and determining an actual speed of reading data from or writing data to the random access memory according to the test speed of reading data from or writing data to the each memory.

The processor 501 is further configured to perform the following steps:

calculating a weighted average value of the test speeds of reading data from or writing data to the plurality of memories; and determining the weighted average value as the actual speed of reading data from or writing data to the random access memory.

The processor 501 is further configured to perform the following steps:

performing a plurality of tests on each of the memories to obtain a test result of each test; and determining an average value of test results of the plurality of tests as the test speed of reading data from or writing data to the memory.

The processor 501 is further configured to perform the following steps:

obtaining a data size for a test for a memory, and duration for reading data of the data size from or writing data of the data size to the memory; and determining the test result of the test of the memory according to the data size and the duration.

The processor 501 is further configured to perform the following step:

determining a value obtained by dividing the data size by the duration as the test result of the test of the memory.

The processor 501 is further configured to perform the following steps:

performing a test simultaneously on the each memory using two threads;

obtaining a test speed component obtained by each of the two threads; and determining a sum of the test speed components obtained by the two threads as the test result of the memory.

The processor 501 is further configured to perform the following step:

creating a thread lock for the two threads.

It should be noted that an embodiment of the present invention further provides a storage medium for storing an application, the application configured to, when being executed, perform operations as the same as those executed by an electronic device in the method for read/write speed testing shown in FIG. 1 and FIG. 3.

It should be noted that an embodiment of the present invention further provides an application which is configured to, when being executed, perform operations executed by an electronic device in the method for read/write speed testing shown in FIG. 1 and FIG. 3.

It should be noted that, for clarity, the above method embodiments are all described as a series of steps. However, those skilled in the art should understand that the present invention is not limited to the order of the steps described above because some steps may be performed in other orders or simultaneously according to the present invention. Those skilled in the art should also understand that the embodiments described herein are all preferred embodiments, and the involved steps and modules may be not mandatory in the present invention.

In the above embodiments, different emphasis is placed on respective embodiments, and reference can be made to related description in other embodiments for portions not detailed in a certain embodiment.

Those having ordinary skills in the art may understand that all or some steps of the methods in the above embodiments can be implemented in a way that a program instructs relevant hardware. The program may be stored in a computer-readable storage medium. The storage medium may comprise: a flash memory, a Read-Only Memory (ROM), a Random Access Memory (RAM), a magnetic disk, or an optical disk.

The method for read/write speed testing and the devices according to embodiments of the present invention are described in detail. Here, specific examples are used to illustrate principles and implementations of the present invention. The above illustration of the embodiments are only used to help to understand the method of the present invention and its core ideas. Those skilled in the art may make variations in specific implementations and in the scope of the present application according to the ideas of the present invention. To conclude, it should be understood that the present invention is not limited to the description herein.

In the description herein, the description of the terms "an embodiment", "some embodiments", "an example", "a specific example", or "some examples" means that particular features, structures, materials, or characteristic described in connection with the embodiments or examples are included in at least one embodiment or example of the present invention. Thus, these terms throughout this specification do not necessarily refer to a same embodiment or example of the present invention. Furthermore, the particular features, structures, materials, or characteristics may be combined in any suitable manner with one or more embodiments or examples. In addition, in the case of no mutual contradiction, those skilled in the art may incorporate or combine different embodiments or examples and features of different embodiments or examples described in the description.

In addition, terms "first" and "second" are only used for illustration and cannot be understood as indicating or implying relative importance or implicitly indicating the number of the technical features that it refers to. Hence, a feature defined by "first" and "second" may explicitly or implicitly indicate that at least one said feature is included. In the depictions of the present invention, "a plurality of" means at least two, for example two, three or the like, unless otherwise definitely and specifically defined.

Any process or method described in the flow charts or described in any other way herein may be understood to comprises one or more modules, portions or parts for storing executable code that realize particular logic functions or procedures. Moreover, the preferred embodiments of the present invention comprise other implementations in which the order of execution may be different from what has been illustrated or discussed, including performing functions substantially simultaneous or in an reverse order according to the related functions. This should be understood by those skilled in the art.

The logics and/or steps and the like described herein or shown in the flow charts, for example, can be a list of executable instructions in a particular order for realizing the logical functions. The list of executable instructions can be specifically achieved in any computer readable medium for use in an instruction execution system, device or equipment (such as a system based on computers, a system comprising processors or other systems capable of obtaining the instructions from the instruction execution system, device and equipment and executing the instruction), or to be used in combination with the instruction execution system, device and equipment. As to this specification, "the computer readable medium" may be any device containing, storing, communicating, propagating or transferring programs to be used by or in combination with the instruction execution system, device or equipment. More specific examples (non-exhaustive) of the computer readable medium comprise but are not limited to: an electronic connection (an electronic device) with one or more wires, a portable computer enclosure (a magnetic device), a random access memory (RAM), a read only memory (ROM), an erasable programmable read-only memory (EPROM or a flash memory), an optical fiber device and a portable compact disk read-only memory (CDROM). In addition, the computer readable medium may even be a paper or other appropriate medium capable of printing program thereon, this is because, for example, the paper or other appropriate medium may be optically scanned and then edited, decrypted or processed in appropriate ways when necessary to obtain the program in an electric manner, and then the program can be stored in computer memories.

It should be understood that each part of the present invention may be realized by the hardware, software, firmware or combinations thereof. In the above embodiments, a plurality of steps or methods may be stored in the memory and be performed by appropriate software or firmware of instruction execution systems. For example, if it is realized by the hardware, likewise in another embodiment, the steps or methods may be realized by one of the following techniques known in the art or combinations thereof: a discrete logic circuit having a logic gate circuit for realizing a logic function of a data signal, an application-specific integrated circuit having an appropriate combinational logic gate circuit, a programmable gate array (PGA), a field programmable gate array (FPGA), and the like.

It should be understood by those skilled in the art that all or some of the steps in the methods of the embodiments above can be implemented by hardware being instructed by program. The program may be stored in a computer readable storage medium, and when the program is executed, one of the steps or combinations thereof in the method will be performed.

In addition, each of the function units of the embodiments of the present invention may be integrated in one processing module, or these units may be separate physical existence, or two or more units are integrated in one module. The integrated module may be realized as hardware or as software function modules. When the integrated module is realized as software function modules and is sold or used as an individual product, the integrated modules may be stored in a computer readable storage medium.

The storage medium mentioned above may be read-only memories, magnetic disks, optical disks or the like. Although embodiments of the present invention have been illustrated and described above, it would be appreciated by those skilled in the art that the above embodiments are exemplary and cannot be construed to limit the present invention, and those having ordinary skill in the art can make changes, modifications, substitutions and variations to the above embodiments within the scope of the present invention.

What is claimed is:

1. A method for read/write speed testing applied to an electronic device, comprising:
    obtaining a test speed of reading data from or writing data to each of a plurality of memories, the plurality of memories comprising a random access memory and at least one buffer memory associated with the random access memory; and
    determining an actual speed of reading data from or writing data to the random access memory according to the test speed of reading data from or writing data to the each memory;
    wherein determining an actual speed of reading data from or writing data to the random access memory according to the test speed of reading data from or writing data to the each memory comprises:
    calculating a weighted average value of test speeds of reading data from or writing data to the plurality of memories; and
    determining the weighted average value as the actual speed of reading data from or writing data to the random access memory.

2. The method of claim 1, wherein obtaining a test speed of reading data from or writing data to each of the plurality of memories comprises:
    performing a plurality of tests on each of the memories to obtain a test result of each test; and
    determining an average value of test results of the plurality of tests as the test speed of reading data from or writing data to the each memory.

3. The method of claim 2, wherein obtaining a test result of each test comprises:
    obtaining a data size for a test for the each memory, and duration for reading data of the data size from or writing data of the data size to the each memory; and
    determining the test result of the each test for the each memory according to the data size and the duration.

4. The method of claim 3, wherein determining a test result of the each test for the each memory according to the data size and the duration comprises:
    determining a value obtained by dividing the data size by the duration as the test result of the each test for the each memory.

5. The method of claim 2, wherein obtaining a test result of the each test comprises:
    performing a test simultaneously on the each memory using two threads;
    obtaining a test speed component obtained by each of the two threads; and
    determining a sum of the test speed components obtained by the two threads as the test result of the each memory.

6. The method of claim 5, wherein the two threads use a thread lock.

7. An electronic device, comprising a processor, a memory, a communication interface and a bus;
    the processor, the memory and the communication interface are connected and communicated with each other via the bus;
    the memory stores executable program code;
    the processor executes a program corresponding to the executable program code by reading the executable program code stored in the memory, to perform a process comprising:

obtaining a test speed of reading data from or writing data to each of a plurality of memories, the plurality of memories comprising a random access memory and at least one buffer memory associated with the random access memory; and determining an actual speed of reading data from or writing data to the random access memory according to the test speed of reading data from or writing data to the each memory;

wherein determining an actual speed of reading data from or writing data to the random access memory according to the test speed of reading data from or writing data to the each memory comprises:

calculating a weighted average value of test speeds of reading data from or writing data to the plurality of memories; and determining the weighted average value as the actual speed of reading data from or writing data to the random access memory.

8. The electronic device according to claim 7, wherein obtaining a test speed of reading data from or writing data to each of the plurality of memories comprises:
performing a plurality of tests on each of the memories to obtain a test result of each test; and
determining an average value of test results of the plurality of tests as the test speed of reading data from or writing data to the each memory.

9. The electronic device according to claim 7, wherein obtaining a test result of each test comprises:
obtaining a data size for a test for the each memory, and duration for reading data of the data size from or writing data of the data size to the each memory; and
determining the test result of the each test for the each memory according to the data size and the duration.

10. The electronic device according to claim 7, wherein determining a test result of the each test for the each memory according to the data size and the duration comprises:
determining a value obtained by dividing the data size by the duration as the test result of the each test for the each memory.

11. The electronic device according to claim 7, wherein obtaining a test result of the each test comprises:
performing a test simultaneously on the each memory using two threads;
obtaining a test speed component obtained by each of the two threads; and
determining a sum of the test speed components obtained by the two threads as the test result of the each memory.

12. The electronic device according to claim 7, wherein the two threads use a thread lock.

13. A non-transitory computer-readable storage medium, storing multiple instructions which can be loaded by a processor to perform a process comprising:

obtaining a test speed of reading data from or writing data to each of a plurality of memories, the plurality of memories comprising a random access memory and at least one buffer memory associated with the random access memory; and determining an actual speed of reading data from or writing data to the random access memory according to the test speed of reading data from or writing data to the each memory;

wherein determining an actual speed of reading data from or writing data to the random access memory according to the test speed of reading data from or writing data to the each memory comprises:

calculating a weighted average value of test speeds of reading data from or writing data to the plurality of memories; and determining the weighted average value as the actual speed of reading data from or writing data to the random access memory.

14. The non-transitory computer-readable storage medium according to claim 13, wherein obtaining a test speed of reading data from or writing data to each of the plurality of memories comprises:
performing a plurality of tests on each of the memories to obtain a test result of each test; and
determining an average value of test results of the plurality of tests as the test speed of reading data from or writing data to the each memory.

15. The non-transitory computer-readable storage medium according to claim 13, wherein obtaining a test result of each test comprises:
obtaining a data size for a test for the each memory, and duration for reading data of the data size from or writing data of the data size to the each memory; and
determining the test result of the each test for the each memory according to the data size and the duration.

16. The non-transitory computer-readable storage medium according to claim 13, wherein determining a test result of the each test for the each memory according to the data size and the duration comprises:
determining a value obtained by dividing the data size by the duration as the test result of the each test for the each memory.

17. The non-transitory computer-readable storage medium according to claim 13, wherein obtaining a test result of the each test comprises:
performing a test simultaneously on the each memory using two threads;
obtaining a test speed component obtained by each of the two threads; and
determining a sum of the test speed components obtained by the two threads as the test result of the each memory.

* * * * *